(12) United States Patent
Yamamoto et al.

(10) Patent No.: US 11,949,394 B2
(45) Date of Patent: Apr. 2, 2024

(54) PHASE SHIFTER AND ANTENNA DEVICE

(71) Applicant: MITSUBISHI ELECTRIC CORPORATION, Tokyo (JP)

(72) Inventors: Wataru Yamamoto, Tokyo (JP); Koji Tsutsumi, Tokyo (JP); Masaomi Tsuru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 143 days.

(21) Appl. No.: 17/846,969

(22) Filed: Jun. 22, 2022

(65) Prior Publication Data
US 2022/0329231 A1    Oct. 13, 2022

Related U.S. Application Data

(63) Continuation of application No. PCT/JP2020/008251, filed on Feb. 28, 2020.

(51) Int. Cl.
*H01Q 3/36* (2006.01)
*H03H 11/20* (2006.01)

(52) U.S. Cl.
CPC .............. *H03H 11/20* (2013.01); *H01Q 3/36* (2013.01)

(58) Field of Classification Search
CPC ................................. H03H 11/20; H01Q 3/36
See application file for complete search history.

(56) References Cited

U.S. PATENT DOCUMENTS

| 2017/0237475 | A1* | 8/2017 | Soga | H03F 3/245 |
| | | | | 455/103 |
| 2018/0316317 | A1* | 11/2018 | Komatsuzaki | H03F 3/19 |
| 2021/0208246 | A1* | 7/2021 | Kohtani | H01Q 3/267 |

FOREIGN PATENT DOCUMENTS

JP    2001-168936 A    6/2001

OTHER PUBLICATIONS

Huang et al., "An Ultra-Compact, Linearly-Controlled Variable Phase Shifter Designed With a Novel RC Poly-Phase Filter", IEEE Transactions on Microwave Theory and Techniques, vol. 60, No. 2, Feb. 2012, pp. 301-310.

* cited by examiner

*Primary Examiner* — Awat M Salih
(74) *Attorney, Agent, or Firm* — Birch, Stewart, Kolasch & Birch, LLP

(57) ABSTRACT

A first phase shift circuit amplifies, when a first signal, a second signal having a phase difference of 90 degrees from the first signal, a third signal having a phase difference of 180 degrees from the first signal, and a fourth signal having a phase difference of 270 degrees from the first signal are output from a 90-degree distributor that distributes an input signal, each of any three signals from among the first signal to the fourth signal. A second phase shift circuit amplifies each of any two signals of any three signals and one signal that is not amplified by the first phase shift circuit from among the first signal to the fourth signal. One or more phase shift circuits of the first phase shift circuit and the second phase shift circuit each include a compensation circuit that compensates for a phase error of the synthesized signal.

18 Claims, 6 Drawing Sheets

PHASE SHIFTER AND ANTENNA DEVICE

CROSS REFERENCE TO RELATED APPLICATIONS

This application is a Continuation of PCT International Application No. PCT/JP2020/008251, filed on Feb. 28, 2020, which is hereby expressly incorporated by reference into the present application.

TECHNICAL FIELD

The present disclosure relates to a phase shifter and an antenna device including the phase shifter.

BACKGROUND ART

An antenna device used in a radar device generally includes a phased array antenna and a phase shifter. When the direction of a beam radiated from the phased array antenna is changed, the phase shifter switches the phase of a high frequency signal provided to the phased array antenna.

As the phase shifter, a vector synthesis type phase shifter can be used. The vector synthesis type phase shifter generally includes a 90-degree distributor that distributes an input signal into four signals, and a plurality of variable gain amplifiers that amplify respective amplitudes of the four signals by amplification factors corresponding to phase shift amounts. Examples of the four signals include a signal having a phase of 0 degrees, a signal having a phase of 90 degrees, a signal having a phase of 180 degrees, and a signal having a phase of 270 degrees. Note that the 90-degree distributor may be provided outside the vector synthesis type phase shifter.

The vector synthesis type phase shifter synthesizes the four amplified signals and outputs a synthesized signal of the four signals as the phase-shifted signal.

The 90-degree distributor is implemented by, for example, a polyphase filter (see, for example, NPL 1).

In the 90-degree distributor described in NPL 1, polyphase filters are connected in multiple stages in order to reduce phase errors of four signals.

CITATION LIST

Non-Patent Literature

Non-Patent Literature 1: Yan-Yu Huang, "An Ultra-Compact, Linearly-Controlled Variable Phase Shifter Designed With a Novel RC Poly-Phase Filter," IEEE TRANSACTIONS ON MICROWAVE THEORY AND TECHNIQUES, VOL. 60, NO. 2, FEBRUARY 2012

SUMMARY OF INVENTION

Technical Problem

The phase accuracy of the phase-shifted signal output from the phase shifter including the 90-degree distributor in which the polyphase filters are connected in multiple stages is improved as the number of stages of the polyphase filters increases. However, as the number of stages of the polyphase filters increases, there is a problem that the power loss of the signal passing through the phase shifter increases.

The present disclosure has been made to solve the above problem, and an object of the present disclosure is to obtain a phase shifter capable of compensating for a phase error of a phase-shifted signal without increasing the number of stages of polyphase filters in a 90-degree distributor.

Solution to Problem

A phase shifter according to the present disclosure includes: a 90-degree distributor to divide an input signal into four signals including a first signal, a second signal having a phase difference of 90 degrees from the first signal, a third signal having a phase difference of 180 degrees from the first signal, and a fourth signal having a phase difference of 270 degrees from the first signal; a first phase shift circuit to amplify each of any three signals from among the first signal to the fourth signal in accordance with a phase shift amount of an output signal to the input signal when a frequency of the input signal is included in a first frequency band, and output a synthesized signal of the three amplified signals; and a second phase shift circuit to amplify, when a frequency of the input signal is included in a second frequency band that does not overlap with the first frequency band and is continuous with the first frequency band, each of any two signals of the any three signals and one signal that is not amplified by the first phase shift circuit from among the first signal to the fourth signal in accordance with the phase shift amount, and output a synthesized signal of the three amplified signals, wherein one or more phase shift circuits of the first phase shift circuit and the second phase shift circuit each include a compensation circuit that compensates for a phase error of a synthesized signal, wherein in a case where the first phase shift circuit includes the circuit compensation circuit, and when the frequency of the input signal is an upper limit frequency of the first frequency band, an RMS (Root Mean Square) of the phase error of the synthesized signal output from the first phase shift circuit is smaller than an RMS of the phase error of the synthesized signal output from a phase shift circuit including the first phase shift circuit and the second phase shift circuit including the compensation circuit, in a case where the second phase shift circuit includes the circuit compensation circuit, and when the frequency of the input signal is a lower limit frequency of the second frequency band, an RMS of the phase error of the synthesized signal output from the first phase shift circuit is smaller than an RMS of the phase error of a synthesized signal output from a phase shift circuit including the first phase shift circuit and the second phase shift circuit each of which includes the compensation circuit.

Advantageous Effects of Invention

According to the present disclosure, the phase shifter is configured so that one or more of the first phase shift circuit and the second phase shift circuit each include a compensation circuit that compensates for a phase error of the synthesized signal. Therefore, the phase shifter according to the present disclosure can compensate for the phase error of the phase-shifted signal without increasing the number of stages of the polyphase filters in the 90-degree distributor.

DESCRIPTION OF EMBODIMENTS

In order to explain the present disclosure in more detail, a mode for carrying out the present disclosure will be described below with reference to the accompanying drawings.

First Embodiment

Figure 1:
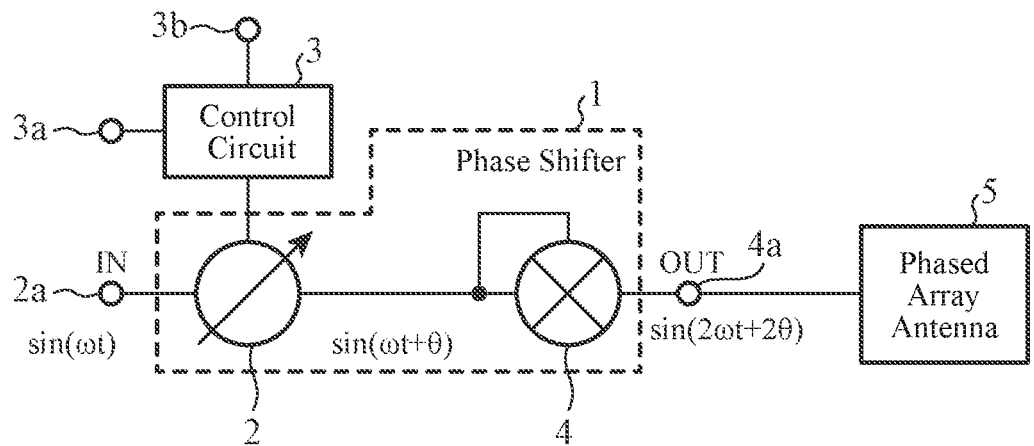
FIG. 1 is a configuration diagram illustrating an antenna device including a phase shifter 1 according to a first embodiment.
Figure 2:
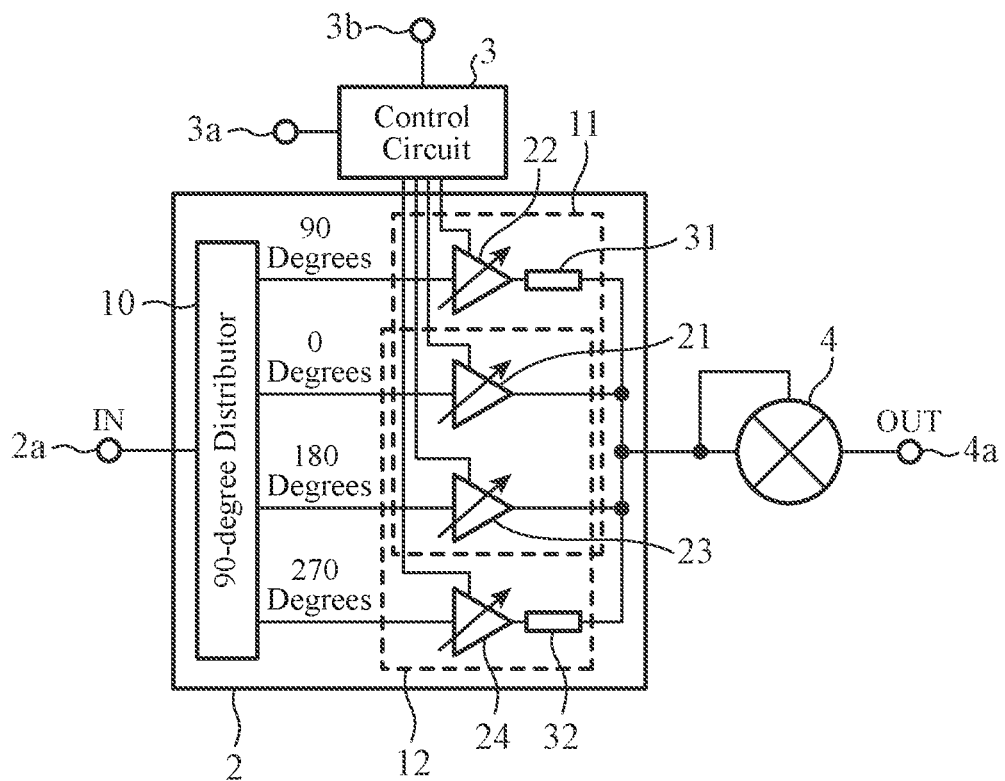
FIG. 2 is a configuration diagram illustrating the phase shifter 1 according to the first embodiment.

FIG. 1 is a configuration diagram illustrating an antenna device including a phase shifter 1 according to a first embodiment. FIG. 2 is a configuration diagram illustrating the phase shifter 1 according to the first embodiment.

The antenna device includes the phase shifter 1, a control circuit 3, and a phased array antenna 5.

Figure 12:
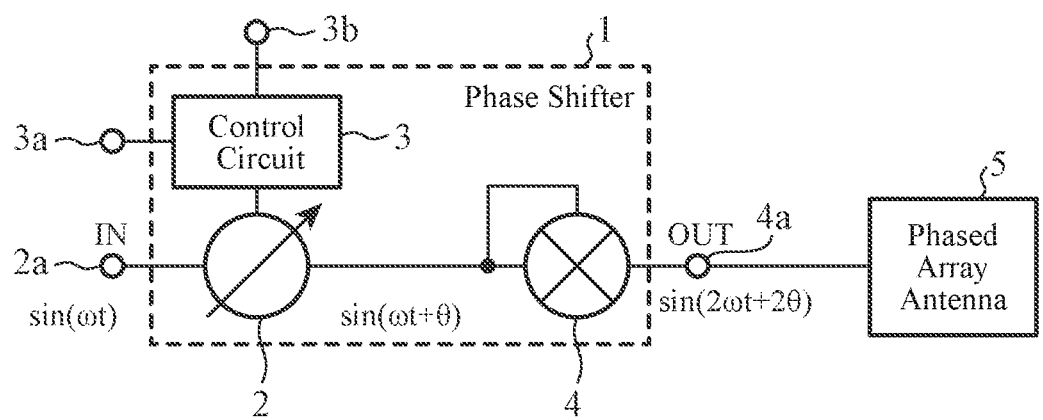
FIG. 12 is a configuration diagram illustrating another antenna device including the phase shifter 1 according to the first embodiment.

The phase shifter 1 is a vector synthesis type phase shifter, and includes a phase shift circuit 2 and a multiplier 4. In the antenna device illustrated in FIG. 1, the control circuit 3 is provided outside the phase shifter 1. However, this is merely an example, and the control circuit 3 may be provided inside the phase shifter 1 as illustrated in FIG. 12. FIG. 12 is a configuration diagram illustrating another antenna device including the phase shifter 1 according to the first embodiment.

When an input signal is given from the outside, the phase shifter 1 shifts the phase of the input signal, and outputs the phase-shifted signal to a phased array antenna 5. The input signal is, for example, a high frequency signal.

The phased array antenna 5 includes a plurality of antenna elements. The antenna element radiates a radio wave related to the phase-shifted signal output from the phase shifter 1 into space.

The antenna device illustrated in FIG. 1 includes only one phase shifter 1 for simplification of the drawing. In practice, the antenna device includes phase shifters 1 as many as the plurality of antenna elements included in the phased array antenna 5.

The phase shift circuit 2 includes a 90-degree distributor 10, a first phase shift circuit 11, and a second phase shift circuit 12.

The phase shift circuit 2 illustrated in FIG. 2 includes the 90-degree distributor 10. However, this is merely an example, and the 90-degree distributor 10 may be provided outside the phase shift circuit 2.

An input terminal 2a of the phase shift circuit 2 is a terminal for inputting an input signal that is a signal to be phase-shifted from the outside of the phase shift circuit 2.

The phase shift circuit 2 shifts the phase of the input signal input from the input terminal 2a and outputs the phase-shifted signal to the multiplier 4.

The 90-degree distributor 10 is implemented by one polyphase filter.

The 90-degree distributor 10 distributes the input signal input from the input terminal 2a into four signals.

That is, the 90-degree distributor 10 distributes the input signal into a first signal, a second signal having a phase difference of 90 degrees from the first signal, a third signal having a phase difference of 180 degrees from the first signal, and a fourth signal having a phase difference of 270 degrees from the first signal.

The 90-degree distributor 10 outputs the first signal, the second signal, and the third signal to the first phase shift circuit 11.

The 90-degree distributor 10 outputs the first signal, the third signal, and the fourth signal to the second phase shift circuit 12.

When the phase of the input signal is 0 degrees, the first signal is a signal having a phase of 0 degrees, and the second signal is a signal having a phase of 90 degrees. The third signal is a signal having a phase of 180 degrees, and the fourth signal is a signal having a phase of 270 degrees.

In this regard, each of the first signal, the second signal, the third signal, and the fourth signal has a phase error, and the magnitude of the phase error varies depending on the frequency of the input signal. Therefore, the phase of the first signal may deviate from 0 degrees, and the phase of the second signal may deviate from 90 degrees. In addition, the phase of the third signal may deviate from 180 degrees, and the phase of the fourth signal may deviate from 270 degrees.

In the phase shift circuit 2 illustrated in FIG. 2, the 90-degree distributor 10 is implemented by one polyphase filter. However, this is merely an example, and the 90-degree distributor 10 may be implemented by a multistage polyphase filter.

In a case where the 90-degree distributor 10 is implemented by a multistage polyphase filter, a phase error generated in each of the first signal, the second signal, the third signal, and the fourth signal is reduced as compared with a case where the 90-degree distributor 10 is implemented by one polyphase filter.

In this regard, the power loss of the signal passing through the phase shifter 1 in which the 90-degree distributor 10 is implemented by a multistage polyphase filter increases as compared with a case where the 90-degree distributor 10 is implemented by one polyphase filter. Therefore, even if the power loss of the signal passing through the phase shifter 1 increases, it is necessary to determine the number of stages of the polyphase filter within a practically acceptable range.

The first phase shift circuit 11 includes a first variable gain amplifier 21, a second variable gain amplifier 22, and a third variable gain amplifier 23. In addition, the first phase shift circuit 11 includes a first phase compensation circuit 31 as a compensation circuit.

When the frequency of an input signal is included in a first frequency band and the phase shift amount of the input signal is larger than zero degrees and equal to or smaller than 180 degrees, the first phase shift circuit 11 amplifies each of the first signal, the second signal, and the third signal in accordance with the phase shift amount of the input signal.

The first phase shift circuit 11 outputs a synthesized signal of the amplified first signal, the amplified second signal, and the amplified third signal to the multiplier 4.

The first frequency band ranges from the center frequency $f_c$ of the frequency band ($f_L$ to $f_H$) in which the phase shifter 1 can shift the phase to the upper limit frequency $f_H$ of the frequency band ($f_L$ to $f_H$) in which the phase shifter 1 can shift the phase.

In the phase shift circuit 2 shown in FIG. 2, the first phase shift circuit 11 amplifies each of the first signal, the second signal, and the third signal. However, this is merely an example, and if the frequency of the input signal is included in the first frequency band, the first phase shift circuit 11 may amplify each of any three signals from among the first signal to the fourth signal in accordance with the phase shift amount of the input signal.

When the phase shift amount of the input signal is, for example, larger than 90 degrees and equal to or smaller than 270 degrees, the first phase shift circuit 11 amplifies each of the second signal, the third signal, and the fourth signal in accordance with the phase shift amount of the input signal, and outputs a synthesized signal of the amplified three signals to the multiplier 4.

When the phase shift amount of the input signal is, for example, larger than 180 degrees and equal to or smaller than 360 degrees, the first phase shift circuit 11 amplifies each of the third signal, the fourth signal, and the first signal in accordance with the phase shift amount of the input signal, and outputs a synthesized signal of the amplified three signals to the multiplier 4.

When the phase shift amount of the input signal is, for example, larger than 270 degrees and equal to or smaller than 450 degrees (=90 degrees), the first phase shift circuit 11 amplifies each of the fourth signal, the first signal, and the second signal in accordance with the phase shift amount of the input signal, and outputs a synthesized signal of the amplified three signals to the multiplier 4.

The second phase shift circuit 12 includes the first variable gain amplifier 21, the third variable gain amplifier 23, and a fourth variable gain amplifier 24. In addition, the second phase shift circuit 12 includes a second phase compensation circuit 32 as a compensation circuit.

When the frequency of the input signal is included in a second frequency band that does not overlap with the first frequency band and is continuous with the first frequency band, and the phase shift amount of the input signal is larger than 180 degrees and equal to or smaller than 360 degrees, the second phase shift circuit 12 amplifies each of the first signal, the third signal, and the fourth signal in accordance with the phase shift amount of the input signal.

The second phase shift circuit 12 outputs a synthesized signal of the amplified first signal, the amplified third signal, and the amplified fourth signal to the multiplier 4.

The second frequency band ranges from the lower limit frequency $f_L$ of the frequency band ($f_L$ to $f_H$) in which the phase shifter 1 can shift the phase to the center frequency $f_c$.

In the phase shift circuit 2 illustrated in FIG. 2, the second phase shift circuit 12 amplifies each of the first signal, the third signal, and the fourth signal. However, this is merely an example, and if the frequency of the input signal is included in the second frequency band, the second phase shift circuit 12 may amplify each of any two signals of the three signals amplified by the first phase shift circuit 11 and one signal not amplified by the first phase shift circuit 11 from among the first signal to the fourth signal in accordance with the phase shift amount of the input signal.

When the phase shift amount of the input signal is, for example, larger than 270 degrees and equal to or smaller than 450 degrees (=90 degrees), the second phase shift circuit 12 amplifies each of the fourth signal, the first signal, and the second signal in accordance with the phase shift amount of the input signal, and outputs a synthesized signal of the three amplified signals to the multiplier 4.

When the phase shift amount of the input signal is, for example, larger than zero degrees and equal to or smaller than 180 degrees, the second phase shift circuit 12 amplifies each of the first signal, the second signal, and the third signal in accordance with the phase shift amount of the input signal, and outputs a synthesized signal of the three amplified signals to the multiplier 4.

When the phase shift amount of the input signal is, for example, larger than 90 degrees and equal to or smaller than 270 degrees, the second phase shift circuit 12 amplifies each of the second signal, the third signal, and the fourth signal in accordance with the phase shift amount of the input signal, and outputs a synthesized signal of the three amplified signals to the multiplier 4.

The first variable gain amplifier 21 amplifies the first signal output from the 90-degree distributor 10 and outputs the amplified first signal to the multiplier 4.

The second variable gain amplifier 22 amplifies the second signal output from the 90-degree distributor 10 and outputs the amplified second signal to the first phase compensation circuit 31.

The third variable gain amplifier 23 amplifies the third signal output from the 90-degree distributor 10 and outputs the amplified third signal to the multiplier 4.

The fourth variable gain amplifier 24 amplifies the fourth signal output from the 90-degree distributor 10 and outputs the amplified fourth signal to the second phase compensation circuit 32.

The first phase compensation circuit 31 is implemented by a circuit that delays a phase or a circuit that advances a phase. The circuit that delays the phase is implemented by, for example, a resistor and a capacitor. The circuit that advances the phase is implemented by, for example, a resistor and an inductor.

The first phase compensation circuit 31 compensates for a phase error of the synthesized signal output from the first phase shift circuit 11 by delaying the phase of the amplified second signal output from the second variable gain amplifier 22 or advancing the phase of the amplified second signal.

The second phase compensation circuit 32 is implemented by a circuit that delays the phase or a circuit that advances the phase.

The second phase compensation circuit 32 compensates for a phase error of the synthesized signal output from the second phase shift circuit 12 by delaying the phase of the amplified fourth signal output from the fourth variable gain amplifier 24 or advancing the phase of the amplified fourth signal.

A frequency information input terminal 3a of the control circuit 3 is a terminal for inputting frequency information indicating the frequency of the input signal from the outside of the control circuit 3.

A phase shift amount input terminal 3b of the control circuit 3 is a terminal for inputting a phase shift amount of the input signal from the outside of the control circuit 3.

When the frequency of the input signal is included in the first frequency band and the phase shift amount of the input signal is larger than zero degrees and equal to or smaller than 180 degrees, the control circuit 3 sets the amplification factor of the fourth variable gain amplifier 24 to zero. In addition, the control circuit 3 adjusts the amplification factor of each of the first variable gain amplifier 21, the second variable gain amplifier 22, and the third variable gain amplifier 23 in accordance with the phase shift amount of the input signal.

When the frequency of the input signal is included in the second frequency band and the phase shift amount of the input signal is larger than 180 degrees and equal to or smaller than 360 degrees, the control circuit 3 sets the amplification factor of the second variable gain amplifier 22 to zero. In addition, the control circuit 3 adjusts the amplification factor of each of the first variable gain amplifier 21, the third variable gain amplifier 23, and the fourth variable gain amplifier 24 in accordance with the phase shift amount of the input signal.

The multiplier 4 is implemented by, for example, a mixer.

The multiplier 4 doubles the frequency of the synthesized signal output from the first phase shift circuit 11 or the frequency of the synthesized signal output from the second phase shift circuit 12. The frequency of the synthesized signal is doubled by the multiplier 4, so that the phase of the synthesized signal is also doubled.

The multiplier 4 outputs the synthesized signal after the frequency multiplication to the phased array antenna 5.

The output terminal 4a of the multiplier 4 is a terminal for outputting the synthesized signal after the frequency multiplication to the phased array antenna 5.

Next, the operation of the phase shifter 1 illustrated in FIG. 2 will be described.

Each of the first signal, the second signal, the third signal, and the fourth signal output from the 90-degree distributor 10 has a different phase error depending on the frequency f of the input signal input from the input terminal 2a.

Since each of the first signal, the second signal, the third signal, and the fourth signal has a phase error, if the phase shift circuit 2 does not include the first phase compensation circuit 31 and the second phase compensation circuit 32, a phase error occurs in the synthesized signal output from the phase shift circuit 2.

Figure 3:
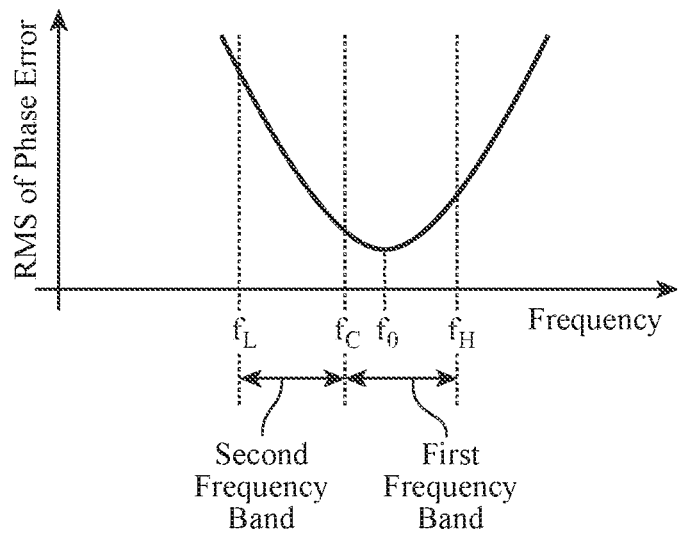
FIG. 3 is an explanatory diagram illustrating a phase error of a synthesized signal output from a phase shift circuit 2 in a case where a first phase shift circuit 11 does not include a first phase compensation circuit 31 and a second phase shift circuit 12 does not include a second phase compensation circuit 32.

FIG. 3 is an explanatory diagram illustrating a phase error of the synthesized signal output from the phase shift circuit 2 when the first phase shift circuit 11 does not include the first phase compensation circuit 31 and the second phase shift circuit 12 does not include the second phase compensation circuit 32.

The horizontal axis of FIG. 3 is a frequency, and the vertical axis of FIG. 3 is a root mean square (RMS) of a phase error $er_\theta$ when the phase shift amount is $\theta$, as shown in the following equation (1). $\theta=1, 2, 3, \ldots, 360$.

$$\text{RMS} = \sqrt{\frac{1}{360}\sum_{\theta=1}^{360}(er_\theta)^2} \quad (1)$$

The RMS of the phase error $er_\theta$ is determined by a transistor size or the like in each of the first variable gain amplifier 21, the second variable gain amplifier 22, the third variable gain amplifier 23, and the fourth variable gain amplifier 24.

In this regard, as illustrated in FIG. 3, the RMS of the phase error $er_\theta$ changes depending on the frequency f of the input signal.

FIG. 3 illustrates an example in which the 90-degree distributor 10 has a high-precision 90-degree phase difference characteristic when the frequency f of the input signal is a frequency $f_0$ higher than the center frequency $f_c$ and lower than the upper limit frequency $f_H$.

Therefore, in the example of FIG. 3, when the frequency f of the input signal is the frequency $f_0$, the RMS of the phase error $er_\theta$ of the synthesized signal output from the phase shift circuit 2 is the minimum. In addition, when the frequency f of the input signal is the lower limit frequency $f_L$, the RMS of the phase error $er_\theta$ of the synthesized signal output from the phase shift circuit 2 is the maximum.

Figure 4:
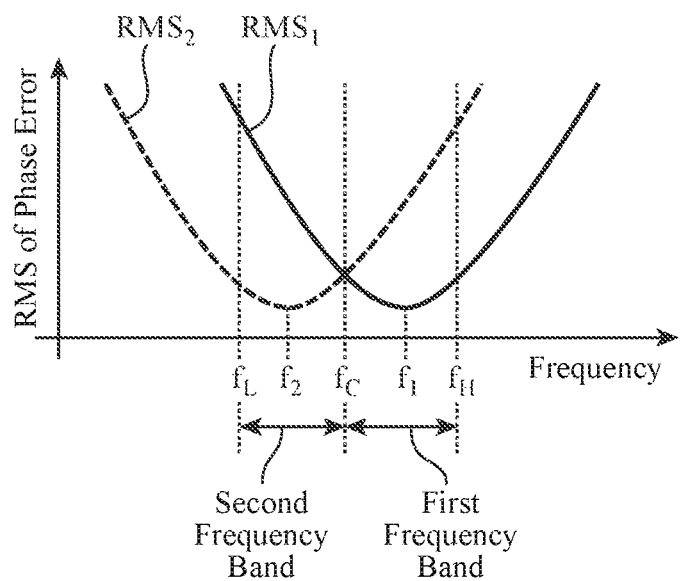
FIG. 4 is an explanatory diagram illustrating a phase error of a synthesized signal output from the phase shift circuit 2 in a case where the first phase shift circuit 11 includes the first phase compensation circuit 31 and the second phase shift circuit 12 includes the second phase compensation circuit 32.

FIG. 4 is an explanatory diagram illustrating a phase error of a synthesized signal output from the phase shift circuit 2 in a case where the first phase shift circuit 11 includes the first phase compensation circuit 31 and the second phase shift circuit 12 includes the second phase compensation circuit 32.

The horizontal axis of FIG. 4 is the frequency, and the vertical axis of FIG. 4 is the RMS of the phase error $er_\theta$ when the phase shift amount is $\theta$, as shown in the equation (1).

$RMS_1$ is the RMS of the phase error $er_\theta$ of the synthesized signal output from the first phase shift circuit 11. In the example of FIG. 4, since the first phase shift circuit 11 includes the first phase compensation circuit 31, the curve indicating $RMS_1$ is obtained by substantially translating the curve indicating RMS illustrated in FIG. 3 to the high frequency side (right side in the figure). The frequency $f_1$ is the frequency f of the input signal at which the RMS of the phase error $er_\theta$ of the synthesized signal output from the first phase shift circuit 11 is the minimum. $f_0 < f_1 < f_H$.

$RMS_2$ is the RMS of the phase error $er_\theta$ of the synthesized signal output from the second phase shift circuit 12. In the example of FIG. 4, since the second phase shift circuit 12 includes the second phase compensation circuit 32, the curve indicating $RMS_2$ is obtained by substantially translating the curve indicating RMS illustrated in FIG. 3 to the low frequency side (left side in the figure). The frequency $f_2$ is the frequency f of the input signal at which the RMS of the phase error $er_\theta$ of the synthesized signal output from the second phase shift circuit 12 is the minimum. $f_L < f_2 < f_0$.

Figure 5:
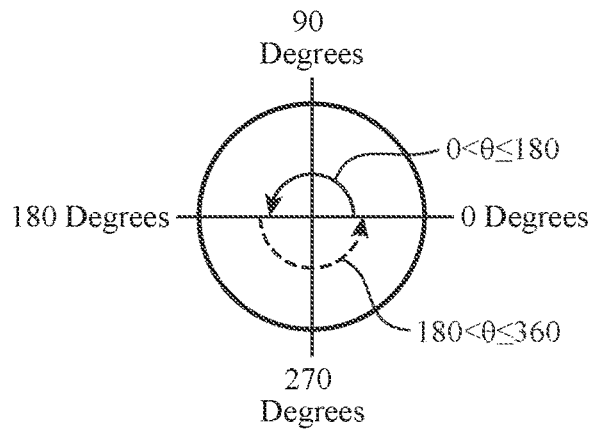
FIG. 5 is an explanatory diagram illustrating a phase shift amount θ of an input signal.

FIG. 5 is an explanatory diagram illustrating a phase shift amount $\theta$ of an input signal.

In FIG. 5, $0 < \theta \leq 180$ indicates that the phase shift amount $\theta$ of the input signal is larger than zero degrees and equal to or smaller than 180 degrees.

$180 < \theta \leq 360$ indicates that the phase shift amount $\theta$ of the input signal is larger than 180 degrees and equal to or smaller than 360 degrees.

Under the condition that the frequency f of the input signal is included in the first frequency band ($f_c$ to $f_H$), and the phase shift amount $\theta$ of the input signal is larger than zero degrees and equal to or smaller than 180 degrees, the synthesized signal is output from the first phase shift circuit 11.

Under the condition that the frequency f of the input signal is included in the second frequency band ($f_L$ to $f_c$), and the phase shift amount $\theta$ of the input signal is larger than 180 degrees and equal to or smaller than 360 degrees, the synthesized signal is output from the second phase shift circuit 12.

Therefore, as illustrated in FIGS. 3 and 4, the $RMS_1$ of the phase error $er_\theta$ of the synthesized signal output from the first phase shift circuit 11 is smaller than RMS of the phase error $er_\theta$ of the synthesized signal output from the phase shift circuit not including the first phase compensation circuit 31 when the frequency f is the upper limit frequency $f_H$.

As illustrated in FIGS. 3 and 4, the $RMS_2$ of the phase error $er_\theta$ of the synthesized signal output from the second phase shift circuit 12 is smaller than the RMS of the phase error $er_\theta$ of the synthesized signal output from the phase shift circuit not including the second phase compensation circuit 32 when the frequency f is the lower limit frequency $f_L$.

When an input signal $\sin(\omega t)$ is input from the input terminal 2a, the 90-degree distributor 10 distributes the input signal $\sin(\omega t)$ into a first signal $\sin(\omega t)$, a second signal $\sin(\omega t+90)$, a third signal $\sin(\omega t+180)$, and a fourth signal $\sin(\omega t+270)$. $\omega$ is the angular frequency and t is the time. $\omega = 2\pi f$.

In this regard, each of the first signal $\sin(\omega t)$, the second signal $\sin(\omega t+90)$, the third signal $\sin(\omega t+180)$, and the fourth signal $\sin(\omega t+270)$ may have a phase error as described above.

The 90-degree distributor 10 outputs the first signal $\sin(\omega t)$, the second signal $\sin(\omega t+90)$, and the third signal $\sin(\omega t+180)$ to the first phase shift circuit 11.

The 90-degree distributor 10 outputs the first signal $\sin(\omega t)$, the third signal $\sin(\omega t+180)$, and the fourth signal $\sin(\omega t+270)$ to the second phase shift circuit 12.

The control circuit 3 acquires the frequency information input from the frequency information input terminal 3a, and acquires the phase shift amount $\theta$ of the input signal input from the phase shift amount input terminal 3b.

When the frequency f of the input signal indicated by the frequency information is included in the first frequency band ($f_c$ to $f_H$) and the phase shift amount $\theta$ of the input signal is larger than zero degrees and equal to or smaller than 180 degrees, the control circuit 3 sets the amplification factor of the fourth variable gain amplifier 24 to zero. In addition, the control circuit 3 adjusts the amplification factor of each of the first variable gain amplifier 21, the second variable gain amplifier 22, and the third variable gain amplifier 23 in accordance with the phase shift amount $\theta$ of the input signal.

When the frequency f of the input signal indicated by the frequency information is included in the second frequency band ($f_L$ to $f_c$) and the phase shift amount $\theta$ of the input signal is larger than 180 degrees and equal to or smaller than 360 degrees, the control circuit 3 sets the amplification factor of the second variable gain amplifier 22 to zero. In addition, the control circuit 3 adjusts the amplification factor of each of the first variable gain amplifier 21, the third variable gain amplifier 23, and the fourth variable gain amplifier 24 in accordance with the phase shift amount $\theta$ of the input signal.

Hereinafter, an adjustment example of the amplification factor by the control circuit 3 will be described. The control circuit 3 adjusts each of the amplification factors assuming that the phase shift circuit 2 does not include the first phase compensation circuit 31 and the second phase compensation circuit 32.

For example, when the phase shift amount $\theta$ of the input signal is larger than zero degrees and smaller than 90 degrees, the control circuit 3 sets an amplification factor $\beta_3$ of the third variable gain amplifier 23 to zero and sets an amplification factor $\beta_4$ of the fourth variable gain amplifier 24 to zero.

Then, the control circuit 3 adjusts an amplification factor $\beta_1$ of the first variable gain amplifier 21 and an amplification factor $\beta_2$ of the second variable gain amplifier 22 so that a synthesized signal of the amplified first signal and the amplified second signal is $\sin(\omega t+\theta)$. Since the processing in itself of adjusting the amplification factor $\beta_1$ and the amplification factor $\beta_2$ so that the synthesized signal is $\sin(\omega t+\theta)$ is a known technique, detailed description thereof will be omitted.

For example, when the phase shift amount $\theta$ of the input signal is larger than 90 degrees and smaller than 180 degrees, the control circuit 3 sets the amplification factor $\beta_1$ of the first variable gain amplifier 21 to zero and sets the amplification factor $\beta_4$ of the fourth variable gain amplifier 24 to zero.

Then, the control circuit 3 adjusts the amplification factor $\beta_2$ of the second variable gain amplifier 22 and the amplification factor $\beta_3$ of the third variable gain amplifier 23 so that a synthesized signal of the amplified second signal and the amplified third signal is $\sin(\omega t+\theta)$.

For example, when the phase shift amount $\theta$ of the input signal is larger than 180 degrees and smaller than 270 degrees, the control circuit 3 sets the amplification factor $\beta_1$ of the first variable gain amplifier 21 to zero and sets the amplification factor $\beta_2$ of the second variable gain amplifier 22 to zero.

Then, the control circuit 3 adjusts the amplification factor $\beta_3$ of the third variable gain amplifier 23 and the amplification factor $\beta_4$ of the fourth variable gain amplifier 24 so that a synthesized signal of the amplified third signal and the amplified fourth signal is $\sin(\omega t+\theta)$.

For example, when the phase shift amount $\theta$ of the input signal is larger than 270 degrees and smaller than 360 degrees, the control circuit 3 sets the amplification factor $\beta_2$ of the second variable gain amplifier 22 to zero and sets the amplification factor $\beta_3$ of the third variable gain amplifier 23 to zero.

Then, the control circuit 3 adjusts the amplification factor $\beta_4$ of the fourth variable gain amplifier 24 and the amplification factor $\beta_1$ of the first variable gain amplifier 21 so that a synthesized signal of the amplified fourth signal and the amplified first signal is $\sin(\omega t+\theta)$.

For example, when the phase shift amount $\theta$ of the input signal is zero degrees, the control circuit 3 sets the amplification factor $\beta_2$ of the second variable gain amplifier 22 to zero, sets the amplification factor $\beta_3$ of the third variable gain amplifier 23 to zero, and sets the amplification factor $\beta_4$ of the fourth variable gain amplifier 24 to zero. Then, the control circuit 3 sets the amplification factor $\beta_1$ of the first variable gain amplifier 21 to 1.

For example, when the phase shift amount $\theta$ of the input signal is 90 degrees, the control circuit 3 sets the amplification factor $\beta_1$ of the first variable gain amplifier 21 to zero, sets the amplification factor $\beta_3$ of the third variable gain amplifier 23 to zero, and sets the amplification factor $\beta_4$ of the fourth variable gain amplifier 24 to zero. Then, the control circuit 3 sets the amplification factor $\beta_2$ of the second variable gain amplifier 22 to 1.

For example, when the phase shift amount θ of the input signal is 180 degrees, the control circuit 3 sets the amplification factor $\beta_1$ of the first variable gain amplifier 21 to zero, sets the amplification factor $\beta_2$ of the second variable gain amplifier 22 to zero, and sets the amplification factor $\beta_4$ of the fourth variable gain amplifier 24 to zero. Then, the control circuit 3 sets the amplification factor $\beta_3$ of the third variable gain amplifier 23 to 1.

For example, when the phase shift amount θ of the input signal is 270 degrees, the control circuit 3 sets the amplification factor $\beta_1$ of the first variable gain amplifier 21 to zero, sets the amplification factor $\beta_2$ of the second variable gain amplifier 22 to zero, and sets the amplification factor $\beta_3$ of the third variable gain amplifier 23 to zero. Then, the control circuit 3 sets the amplification factor $\beta_4$ of the fourth variable gain amplifier 24 to 1.

Here, for convenience of description, it is assumed that the 90-degree distributor 10 is designed so that the 90-degree phase difference characteristic of the 90-degree distributor 10 is highly accurate when the frequency f of the input signal is the center frequency $f_c$.

Figure 6:
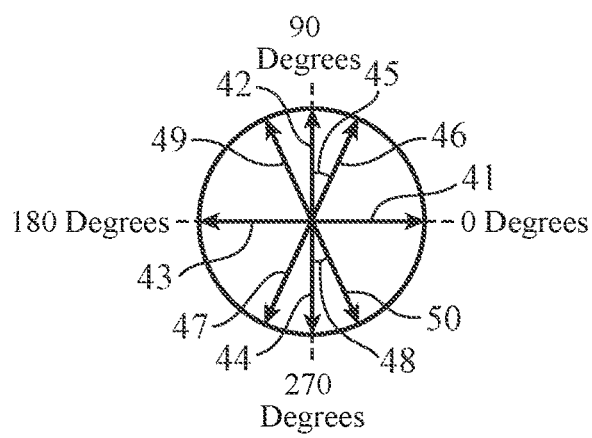
FIG. 6 is an explanatory diagram illustrating polar coordinate displays of each of a first signal, a second signal, a third signal, and a fourth signal output from a 90-degree distributor 10 having a high-precision 90-degree phase difference characteristic when a frequency f of an input signal is a center frequency $f_c$.

FIG. 6 is an explanatory diagram illustrating polar coordinate displays of each of a first signal, a second signal, a third signal, and a fourth signal output from the 90-degree distributor 10 having a high-precision 90-degree phase difference characteristic when the frequency f of the input signal is the center frequency $f_c$.

When the frequency f of the input signal is the center frequency $f_c$, as illustrated in FIG. 6, the first signal is a signal 41 in the zero-degree direction, and the signal 41 is input to the first variable gain amplifier 21. The second signal is a signal 42 in a 90-degree direction and the signal 42 is input to the second variable gain amplifier 22. The third signal is a signal 43 in a 180-degree direction and the signal 43 is input to the third variable gain amplifier 23. The fourth signal is a signal 44 in a 270-degree direction and the signal 44 is input to the fourth variable gain amplifier 24.

However, when the frequency f of the input signal is higher than the center frequency $f_c$, a phase error 45 occurs, and a signal 46 having the phase error 45 is input to the second variable gain amplifier 22 as the second signal. In addition, a signal 47 having the phase error 45 is input to the fourth variable gain amplifier 24 as the fourth signal.

When the frequency f of the input signal is lower than the center frequency $f_c$, a phase error 48 occurs, and a signal 49 having the phase error 48 is input to the second variable gain amplifier 22 as the second signal. A signal 50 having the phase error 48 is input to the fourth variable gain amplifier 24 as the fourth signal.

In the example of FIG. 6, the 90-degree distributor 10 is designed so that the phase of the signal 46 having the phase error 45 advances more than the phase of the signal 42 in the 90-degree direction. Therefore, the first phase compensation circuit 31 is designed to have a delay amount that can delay the phase of the signal 46 and bring the phase of the signal 46 closer to the phase of the signal 42. Note that, in some cases, the phase shifter 1 is designed so that the phase of the signal 46 having the phase error 45 is delayed from the phase of the signal 42 in the 90-degree direction. In this case, the first phase compensation circuit 31 is designed to have an advance amount that can advance the phase of the signal 46 and bring the phase of the signal 46 closer to the phase of the signal 42.

In the example of FIG. 6, the 90-degree distributor 10 is designed so that the phase of the signal 50 having the phase error 48 is delayed from the phase of the signal 44 in the 270-degree direction. Thus, the second phase compensation circuit 32 is designed to have an advance amount that can advance the phase of the signal 50 and bring the phase of the signal 50 closer to the phase of the signal 44. Note that, in some cases, the 90-degree distributor 10 is designed so that the phase of the signal 50 having the phase error 48 advances more than the phase of the signal 44 in the 270-degree direction. In this case, the second phase compensation circuit 32 is designed to have a delay amount that can delay the phase of the signal 50 and bring the phase of the signal 50 closer to the phase of the signal 44.

As described above, when the frequency f of the input signal is included in the first frequency band ($f_c$ to $f_H$) and the phase shift amount θ of the input signal is larger than zero degrees and equal to or smaller than 180 degrees, the phase error of the amplified second signal output from the second variable gain amplifier 22 is compensated by the first phase compensation circuit 31.

When the frequency f of the input signal is included in the second frequency band ($f_L$ to $f_c$) and the phase shift amount θ of the input signal is larger than 180 degrees and equal to or smaller than 360 degrees, the phase error of the amplified fourth signal output from the fourth variable gain amplifier 24 is compensated by the second phase compensation circuit 32.

Figure 7:
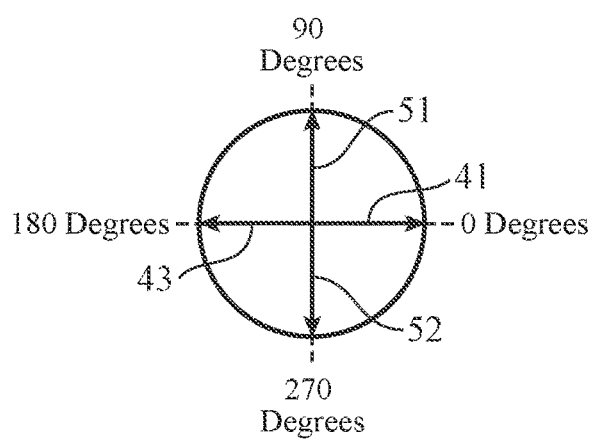
FIG. 7 is an explanatory diagram illustrating polar coordinate displays of each of a first signal after amplification by a first variable gain amplifier 21, a second signal after phase compensation by the first phase compensation circuit 31, a third signal after amplification by a third variable gain amplifier 23, and a fourth signal after phase compensation by the second phase compensation circuit 32.

FIG. 7 is an explanatory diagram illustrating polar coordinate displays of each of the first signal after amplification by the first variable gain amplifier 21, the second signal after phase compensation by the first phase compensation circuit 31, the third signal after amplification by the third variable gain amplifier 23, and the fourth signal after phase compensation by the second phase compensation circuit 32.

In FIG. 7, the same reference numerals as those in FIG. 6 denote the same or corresponding parts, and thus description thereof is omitted.

The second signal after phase compensation by the first phase compensation circuit 31 is a signal 51 in an about 90-degree direction, and the signal 51 is input to the second variable gain amplifier 22.

The fourth signal after phase compensation by the second phase compensation circuit 32 is a signal 52 in an about 270-degree direction, and the signal 52 is input to the fourth variable gain amplifier 24.

The phase error of the amplified second signal output from the second variable gain amplifier 22 is compensated by the first phase compensation circuit 31, whereby the RMS of the phase error $er_\theta$ of the synthesized signal output from the first phase shift circuit 11 is $RMS_1$ illustrated in FIG. 4.

The phase error of the amplified fourth signal output from the fourth variable gain amplifier 24 is compensated by the second phase compensation circuit 32, whereby the RMS of the phase error $er_\theta$ of the synthesized signal output from the second phase shift circuit 12 is $RMS_2$ illustrated in FIG. 4.

When the frequency f of the input signal is included in the first frequency band ($f_c$ to $f_H$), the multiplier 4 acquires the synthesized signal sin(ωt+θ) output from the first phase shift circuit 11.

When the frequency f of the input signal is included in the second frequency band ($f_L$ to $f_c$), the multiplier 4 acquires the synthesized signal sin(ωt+θ) output from the second phase shift circuit 12.

The multiplier 4 doubles the frequency of the synthesized signal sin(ωt+θ) by calculating the square of the acquired synthesized signal sin(ωt+θ). The frequency of the synthesized signal is doubled by the multiplier 4, so that the phase θ of the synthesized signal is also doubled.

The multiplier 4 outputs the synthesized signal sin(2ωt+ 2θ) after the frequency multiplication to the phased array antenna 5.

The phase shift amount θ when the frequency f of the input signal is included in the first frequency band ($f_c$ to $f_H$) is limited to the range of 0<θ≤180. However, since the phase of the synthesized signal after the frequency multiplication is 2θ, the phase shift amount of the phase shifter 1 when the frequency f is included in the first frequency band ($f_c$ to $f_H$) is in the range of 360 degrees.

In addition, the phase shift amount θ when the frequency f of the input signal is included in the second frequency band ($f_L$ to $f_c$) is limited to the range of 180<θ≤360. However, since the phase of the synthesized signal after the frequency multiplication is 2θ, the phase shift amount of the phase shifter 1 when the frequency f is included in the second frequency band ($f_L$ to $f_c$) is in the range of 360 degrees.

In the first embodiment described above, the phase shifter 1 includes the first phase shift circuit 11 to amplify, when the first signal, the second signal having a phase difference of 90 degrees from the first signal, the third signal having a phase difference of 180 degrees from the first signal, and the fourth signal having a phase difference of 270 degrees from the first signal are output from the 90-degree distributor 10 that distributes the input signal, each of any three signals from among the first signal to the fourth signal in accordance with the phase shift amount of the input signal when a frequency of the input signal is included in a first frequency band, and output a synthesized signal of the three amplified signals. Further, the phase shifter 1 includes the second phase shift circuit 12 to amplify, when a frequency of the input signal is included in a second frequency band that does not overlap with the first frequency band and is continuous with the first frequency band, each of any two signals of the any three signals and one signal that is not amplified by the first phase shift circuit 11 from among the first signal to the fourth signal in accordance with the phase shift amount, and output a synthesized signal of the three amplified signals. The phase shifter 1 is configured so that one or more phase shift circuits of the first phase shift circuit 11 and the second phase shift circuit 12 each include a compensation circuit that compensates for a phase error of a synthesized signal. Therefore, the phase shifter 1 can compensate for the phase error of the phase-shifted signal without increasing the number of stages of the polyphase filters in the 90-degree distributor 10.

In the phase shifter 1 illustrated in FIG. 2, the first phase compensation circuit 31 is connected to the output side of the second variable gain amplifier 22, and the second phase compensation circuit 32 is connected to the output side of the fourth variable gain amplifier 24. However, this is merely an example, and the first phase compensation circuit 31 may be connected to the input side of the second variable gain amplifier 22, and the second phase compensation circuit 32 may be connected to the input side of the fourth variable gain amplifier 24.

Second Embodiment

In a second embodiment, a phase shifter 1 in which a first phase shift circuit 11 includes a first phase compensation circuit 31 and a second phase shift circuit 12 does not include a second phase compensation circuit 32 will be described.

Figure 8:
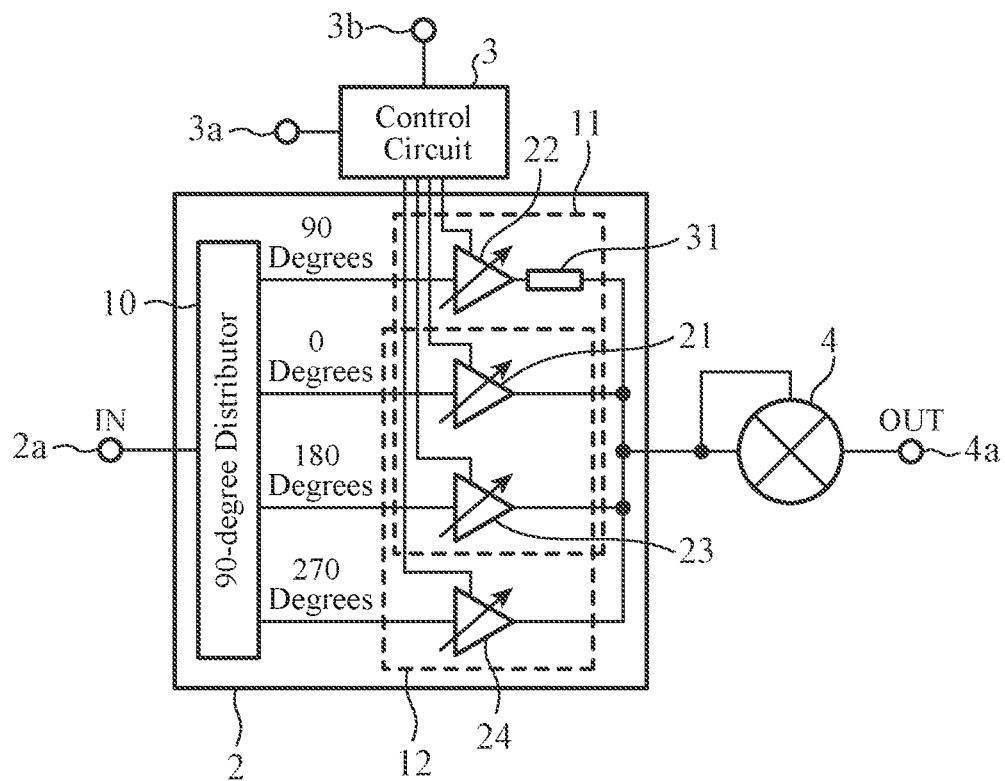
FIG. 8 is a configuration diagram illustrating a phase shifter 1 according to a second embodiment.

FIG. 8 is a configuration diagram illustrating the phase shifter 1 according to the second embodiment. In FIG. 8, the same reference numerals as those in FIG. 2 denote the same or corresponding parts, and thus description thereof is omitted.

In the phase shifter 1 illustrated in FIG. 8, when the frequency f of the input signal is a frequency lower than the center frequency $f_c$, for example, $f_L+(f_c-f_L)/2$, the 90-degree distributor 10 has a highly accurate 90-degree phase difference characteristic.

Figure 9:
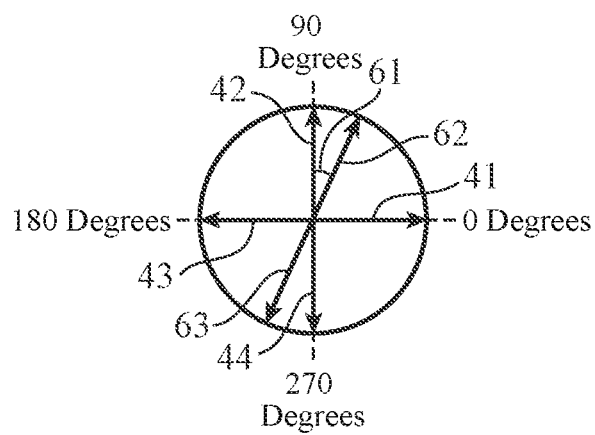
FIG. 9 is an explanatory diagram illustrating polar coordinate displays of each of a first signal, a second signal, a third signal, and a fourth signal output from the 90-degree distributor 10 having a high-precision 90-degree phase difference characteristic when a frequency f of an input signal is lower than a center frequency $f_c$.

FIG. 9 is an explanatory diagram illustrating polar coordinate displays of each of the first signal, the second signal, the third signal, and the fourth signal output from the 90-degree distributor 10 having the high-precision 90-degree phase difference characteristic when the frequency f of the input signal is lower than the center frequency $f_c$.

When the frequency f of the input signal is $f_L+(f_c-f_L)/2$, as illustrated in FIG. 9, the first signal is a signal 41 in a zero-degree direction, and the signal 41 is input to the first variable gain amplifier 21. The second signal is a signal 42 in a 90-degree direction and the signal 42 is input to the second variable gain amplifier 22. The third signal is a signal 43 in a 180-degree direction and the signal 43 is input to the third variable gain amplifier 23. The fourth signal is a signal 44 in a 270-degree direction and the signal 44 is input to the fourth variable gain amplifier 24.

However, when the frequency f of the input signal is included, for example, in the first frequency band ($f_c$ to $f_H$), a phase error 61 occurs, and a signal 62 having the phase error 61 is input to the second variable gain amplifier 22 as the second signal. A signal 63 having the phase error 61 is input to the fourth variable gain amplifier 24 as the fourth signal.

In the example of FIG. 9, the 90-degree distributor 10 is designed so that the phase of the signal 62 having the phase error 61 advances more than the phase of the signal 42 in the 90-degree direction. Therefore, the first phase compensation circuit 31 is designed to have a delay amount that can delay the phase of the signal 62 and bring the phase of the signal 62 closer to the phase of the signal 42. Note that, in some cases, the phase shifter 1 is designed so that the phase of the signal 62 having the phase error 61 is delayed from the phase of the signal 42 in the 90-degree direction. In this case, the first phase compensation circuit 31 is designed to have an advance amount that can advance the phase of the signal 62 and bring the phase of the signal 62 closer to the phase of the signal 42.

As described above, when the frequency f of the input signal is included in the first frequency band ($f_c$ to $f_H$) and the phase shift amount θ of the input signal is larger than zero degrees and equal to or smaller than 180 degrees, the phase error of the amplified second signal output from the second variable gain amplifier 22 is compensated by the first phase compensation circuit 31.

When the frequency f of the input signal is included in the second frequency band ($f_L$ to $f_c$) and the phase shift amount θ of the input signal is larger than 180 degrees and equal to or smaller than 360 degrees, the phase error of the amplified fourth signal output from the fourth variable gain amplifier 24 is small, so that the phase error is not compensated.

In the second embodiment described above, the phase shifter 1 illustrated in FIG. 8 is configured so that the first phase shift circuit 11 includes, as the compensation circuit, the first phase compensation circuit 31 that compensates for the phase error of the second signal after amplification by the second variable gain amplifier 22. Therefore, similarly to the phase shifter 1 illustrated in FIG. 2, the phase shifter 1 illustrated in FIG. 8 can compensate for the phase error of the phase-shifted signal without increasing the number of stages of the polyphase filters in the 90-degree distributor 10. In addition, the phase shifter 1 illustrated in FIG. 8 can achieve a simpler configuration than the phase shifter 1 illustrated in FIG. 2.

Third Embodiment

In a third embodiment, a phase shifter 1 in which a second phase shift circuit 12 includes a second phase compensation circuit 32 and a first phase shift circuit 11 does not include a first phase compensation circuit 31 will be described.

Figure 10:
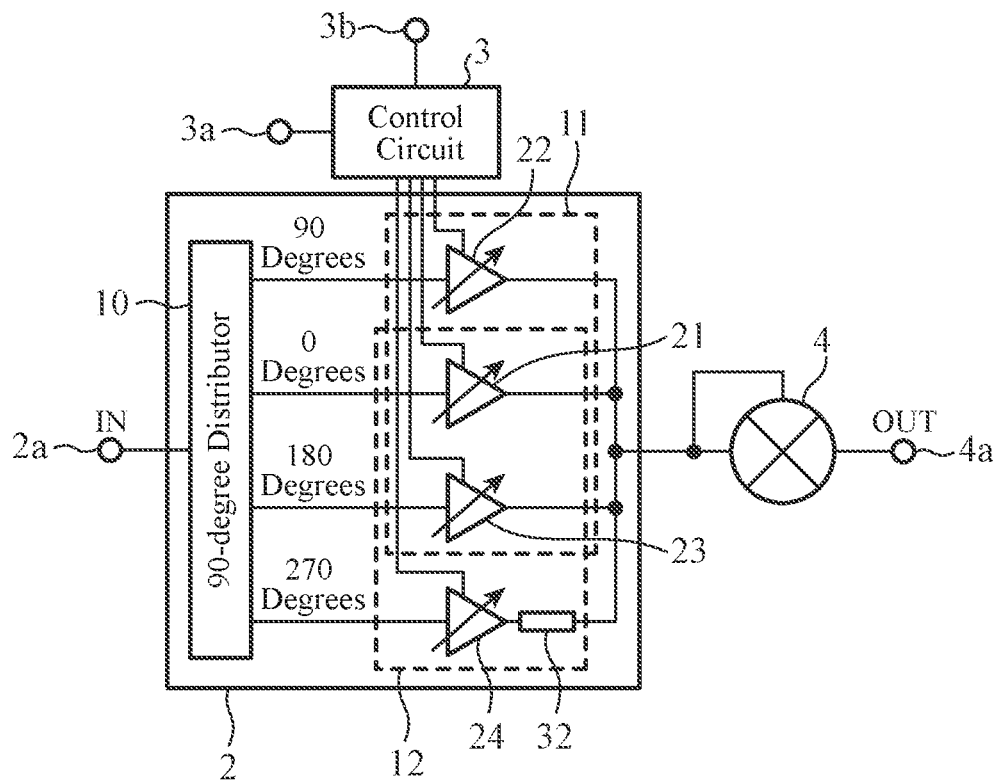
FIG. 10 is a configuration diagram illustrating a phase shifter 1 according to a third embodiment.

FIG. 10 is a configuration diagram illustrating the phase shifter 1 according to the third embodiment. In FIG. 10, the same reference numerals as those in FIG. 2 denote the same or corresponding parts, and thus description thereof is omitted.

In the phase shifter 1 illustrated in FIG. 10, when the frequency f of the input signal is a frequency higher than the center frequency $f_c$, for example, $f_c+(f_H-f_c)/2$, the 90-degree distributor 10 has a highly accurate 90-degree phase difference characteristic.

Figure 11:
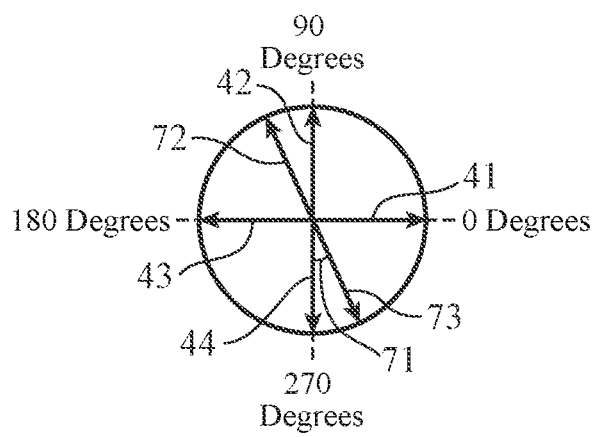
FIG. 11 is an explanatory diagram illustrating polar coordinate displays of each of a first signal, a second signal, a third signal, and a fourth signal output from the 90-degree distributor 10 having a high-precision 90-degree phase difference characteristic when a frequency f of an input signal is higher than a center frequency $f_c$.

FIG. 11 is an explanatory diagram illustrating polar coordinate displays of each of the first signal, the second signal, the third signal, and the fourth signal output from the 90-degree distributor 10 having the high-precision 90-degree phase difference characteristic when the frequency f of the input signal is higher than the center frequency $f_c$.

When the frequency f of the input signal is $f_c+(f_H-f_c)/2$, as illustrated in FIG. 11, the first signal is a signal 41 in a zero-degree direction, and the signal 41 is input to the first variable gain amplifier 21. The second signal is a signal 42 in a 90-degree direction and the signal 42 is input to the second variable gain amplifier 22. The third signal is a signal 43 in a 180-degree direction and the signal 43 is input to the third variable gain amplifier 23. The fourth signal is a signal 44 in a 270-degree direction and the signal 44 is input to the fourth variable gain amplifier 24.

However, when the frequency f of the input signal is included in, for example, the second frequency band ($f_L$ to $f_c$), a phase error 71 occurs, and a signal 72 having the phase error 71 is input to the second variable gain amplifier 22 as the second signal. A signal 73 having the phase error 71 is input to the fourth variable gain amplifier 24 as the fourth signal.

In the example of FIG. 11, the 90-degree distributor 10 is designed so that the phase of the signal 73 having the phase error 71 is delayed from the phase of the signal 44 in the 270-degree direction. Thus, the second phase compensation circuit 32 is designed to have an advance amount that can advance the phase of the signal 73 and bring the phase of the signal 73 closer to the phase of the signal 44. Note that, in some cases, the 90-degree distributor 10 is designed so that the phase of the signal 73 having the phase error 71 advances more than the phase of the signal 44 in the 270-degree direction. In this case, the second phase compensation circuit 32 is designed to have a delay amount that can delay the phase of the signal 73 and bring the phase of the signal 73 closer to the phase of the signal 44.

As described above, when the frequency f of the input signal is included in the second frequency band ($f_L$ to $f_c$) and the phase shift amount θ of the input signal is larger than 180 degrees and equal to or smaller than 360 degrees, the phase error of the amplified fourth signal output from the fourth variable gain amplifier 24 is compensated by the second phase compensation circuit 32.

When the frequency f of the input signal is included in the first frequency band ($f_c$ to $f_H$) and the phase shift amount θ of the input signal is larger than zero degrees and equal to or smaller than 180 degrees, the phase error of the amplified second signal output from the second variable gain amplifier 22 is small, so that the phase error is not compensated.

In the third embodiment described above, the phase shifter 1 illustrated in FIG. 10 is configured so that the second phase shift circuit 12 includes, as a compensation circuit, the second phase compensation circuit 32 that compensates for the phase error of the fourth signal after amplification by the fourth variable gain amplifier 24. Therefore, similarly to the phase shifter 1 illustrated in FIG. 2, the phase shifter 1 illustrated in FIG. 10 can compensate for the phase error of the phase-shifted signal without increasing the number of stages of the polyphase filters in the 90-degree distributor 10. In addition, the phase shifter 1 illustrated in FIG. 10 can achieve a simpler configuration than the phase shifter 1 illustrated in FIG. 2.

In the first to third embodiments, the phase shifter 1 has been described on the assumption that the second frequency band is lower than the first frequency band. However, this is merely an example, and the second frequency band may be higher than the first frequency band.

It should be noted that the present disclosure can freely combine the embodiments, modify any constituent element of each embodiment, or omit any constituent element in each embodiment.

INDUSTRIAL APPLICABILITY

The present disclosure is suitable for a phase shifter and an antenna device including the phase shifter.

REFERENCE SIGNS LIST

1: Phase shifter, 2: Phase shift circuit, 2a: Input terminal, 3: Control circuit, 3a: Frequency information input terminal, 3b: Phase shift amount input terminal, 4: Multiplier, 4a: Output terminal, 5: Phased array antenna, 10: 90-degree distributor, 11: First phase shift circuit, 12: Second phase shift circuit, 21: First variable gain amplifier, 22: Second variable gain amplifier, 23: Third variable gain amplifier, 24: Fourth variable gain amplifier, 31: First phase compensation circuit, 32: Second phase compensation circuit, 41: Signal in a zero-degree direction, 42: Signal in a 90-degree direction, 43: Signal in a 180-degree direction, 44: Signal in a 270-degree direction, 45: Phase error, 46 and 47: Signal with phase error, 48: Phase error, 49 and 50: Signal with phase error, 51: Signal in a 90-degree direction, 52: Signal in a 270-degree direction, 61: Phase error, 62 and 63: Signal with phase error, 71: Phase error, 72 and 73: Signal with phase error

What is claimed is:
1. A phase shifter comprising:
a 90-degree distributor to divide an input signal into four signals including a first signal, a second signal having a phase difference of 90 degrees from the first signal, a third signal having a phase difference of 180 degrees from the first signal, and a fourth signal having a phase difference of 270 degrees from the first signal; a first phase shift circuit to amplify each of any three signals from among the first signal to the fourth signal in accordance with a phase shift amount of an output signal to the input signal when a frequency of the input signal is included in a first frequency band, and output a synthesized signal of the three amplified signals; and a second phase shift circuit to amplify, when a frequency of the input signal is included in a second frequency band that does not overlap with the first frequency band and is continuous with the first frequency band, each of any two signals of the any three signals and one signal that is not amplified by the first phase shift circuit from among the first signal to the fourth signal in accordance with the phase shift amount, and output a synthesized signal of the three amplified signals, wherein one or more phase shift circuits of the first phase shift circuit and the second phase shift circuit each include a compensation circuit that compensates for a phase error of a synthesized signal, wherein in a case where the first phase shift circuit includes the circuit compensation circuit, and when the frequency of the input signal is an upper limit frequency of the first frequency band, an RMS (Root Mean Square) of the phase error of the synthesized signal output from the first phase shift circuit is smaller than an RMS of the phase error of the synthesized signal output from a phase shift circuit including the first phase shift circuit and the second phase shift circuit including the compensation circuit, in a case where the second phase shift circuit includes the circuit compensation circuit, and when the frequency of the input signal is a lower limit frequency of the second frequency band, an RMS of the phase error of the synthesized signal output from the first phase shift circuit is smaller than an RMS of the phase error of a synthesized signal output from a phase shift circuit including the first phase shift circuit and the second phase shift circuit each of which includes the compensation circuit.

2. The phase shifter according to claim 1, wherein
the first phase shift circuit amplifies, when a frequency of the input signal is included in the first frequency band and a phase shift amount of an output signal to the input signal is larger than zero degrees and equal to or smaller than 180 degrees, each of the first signal, the second signal, and the third signal in accordance with the phase shift amount, and outputs a synthesized signal of the amplified first signal, the amplified second signal, and the amplified third signal, and the second phase shift circuit amplifies, when a frequency of the input signal is included in the second frequency band and a phase shift amount of an output signal to the input signal is larger than 180 degrees and equal to or smaller than 360 degrees, each of the first signal, the third signal, and the fourth signal in accordance with the phase shift amount, and outputs a synthesized signal of the amplified first signal, the amplified third signal, and the amplified fourth signal.

3. The phase shifter according to claim 2, wherein
the first phase shift circuit includes:
a first variable gain amplifier to amplify the first signal output from the 90-degree distributor;
a second variable gain amplifier to amplify the second signal output from the 90-degree distributor; and
a third variable gain amplifier to amplify the third signal output from the 90-degree distributor, and
the second phase shift circuit includes:
the first variable gain amplifier;
the third variable gain amplifier; and a fourth variable gain amplifier to amplify the fourth signal output from the 90-degree distributor.

4. An antenna device comprising the phase shifter according to claim 2.

5. The phase shifter according to claim 3, wherein
the first phase shift circuit includes, as the compensation circuit, a first phase compensation circuit to compensate for a phase error of a second signal after amplification by the second variable gain amplifier, and
the second phase shift circuit includes, as the compensation circuit, a second phase compensation circuit to compensate for a phase error of the fourth signal after amplification by the fourth variable gain amplifier.

6. An antenna device comprising the phase shifter according to claim 5.

7. The phase shifter according to claim 3, wherein
the first phase shift circuit includes, as the compensation circuit, a first phase compensation circuit to compensate for a phase error of the second signal after amplification by the second variable gain amplifier.

8. An antenna device comprising the phase shifter according to claim 7.

9. The phase shifter according to claim 3, wherein
the second phase shift circuit includes, as the compensation circuit, a second phase compensation circuit to compensate for a phase error of the fourth signal after amplification by the fourth variable gain amplifier.

10. An antenna device comprising the phase shifter according to claim 9.

11. The phase shifter according to claim 3, further comprising a control circuit to set, when a frequency of the input signal is included in the first frequency band and a phase shift amount of an output signal to the input signal is larger than zero degrees and equal to or smaller than 180 degrees, an amplification factor of the fourth variable gain amplifier to zero, and adjust an amplification factor of each of the first variable gain amplifier, the second variable gain amplifier, and the third variable gain amplifier in accordance with the phase shift amount, and set, when the frequency is included in the second frequency band and a phase shift amount of an output signal to the input signal is larger than 180 degrees and equal to or smaller than 360 degrees, an amplification factor of the second variable gain amplifier to zero, and adjust an amplification factor of each of the first variable gain amplifier, the third variable gain amplifier, and the fourth variable gain amplifier in accordance with the phase shift amount.

12. An antenna device comprising the phase shifter according to claim 11.

13. An antenna device comprising the phase shifter according to claim 3.

14. The phase shifter according to claim 1, further comprising a multiplier to double a frequency of the synthesized signal output from the first phase shift circuit or a frequency of the synthesized signal output from the second phase shift circuit.

15. An antenna device comprising the phase shifter according to claim 14.

16. The phase shifter according to claim 1, further comprising a 90-degree distributor to distribute the input signal into the first signal, the second signal, the third signal, and the fourth signal.

17. An antenna device comprising the phase shifter according to claim 16.

18. An antenna device comprising the phase shifter according to claim 1.

\* \* \* \* \*